United States Patent [19]

Nishimura

[11] 4,446,516

[45] May 1, 1984

[54] DATA COMPACTION SYSTEM WITH CONTIGUOUS STORAGE OF NON-REDUNDANT INFORMATION AND RUN LENGTH COUNTS

[75] Inventor: Toshifumi Nishimura, Minamiashigara, Japan

[73] Assignee: Hitachi, Ltd., Tokyo, Japan

[21] Appl. No.: 247,265

[22] Filed: Mar. 25, 1981

[30] Foreign Application Priority Data

Mar. 31, 1980 [JP] Japan .............................. 55-42673

[51] Int. Cl.³ .......................... G06F 3/00; G06F 5/00; G06F 7/02; H03K 13/00
[52] U.S. Cl. .................................. 364/200; 358/260; 340/347 DD
[58] Field of Search ................ 364/200, 900; 358/260; 340/347 DD

[56] References Cited

U.S. PATENT DOCUMENTS

| | | | |
|---|---|---|---|
| 3,535,696 | 10/1970 | Webb | 364/200 |
| 3,976,844 | 8/1976 | Betz | 179/15.55 R |
| 4,031,515 | 6/1977 | Kashio | 364/200 |
| 4,131,915 | 12/1978 | Nakagome et al. | 358/260 |
| 4,134,133 | 1/1979 | Teramura et al. | 358/261 |
| 4,206,346 | 6/1980 | Hirosawa et al. | 235/92 PD |
| 4,232,375 | 11/1980 | Paugstat et al. | 364/900 |
| 4,272,810 | 6/1981 | Gates et al. | 364/900 |
| 4,296,439 | 10/1981 | Teramura et al. | 358/257 |
| 4,330,844 | 5/1982 | Dubuc | 364/900 |
| 4,399,467 | 8/1983 | Subramaniam | 358/261 |
| 4,409,621 | 10/1983 | Richards et al. | 358/260 |

Primary Examiner—James D. Thomas
Assistant Examiner—Archie E. Williams, Jr.
Attorney, Agent, or Firm—Antonelli, Terry & Wands

[57] ABSTRACT

A plurality of sequentially occuring information signals are stored in a memory by considering past record of the information signals. The number of times the same information occurs is counted, and when the information changes, the current count and the newly generated information are stored in the memory. The method of the invention thus enables much information to be stored in a small-capacity memory.

5 Claims, 12 Drawing Figures

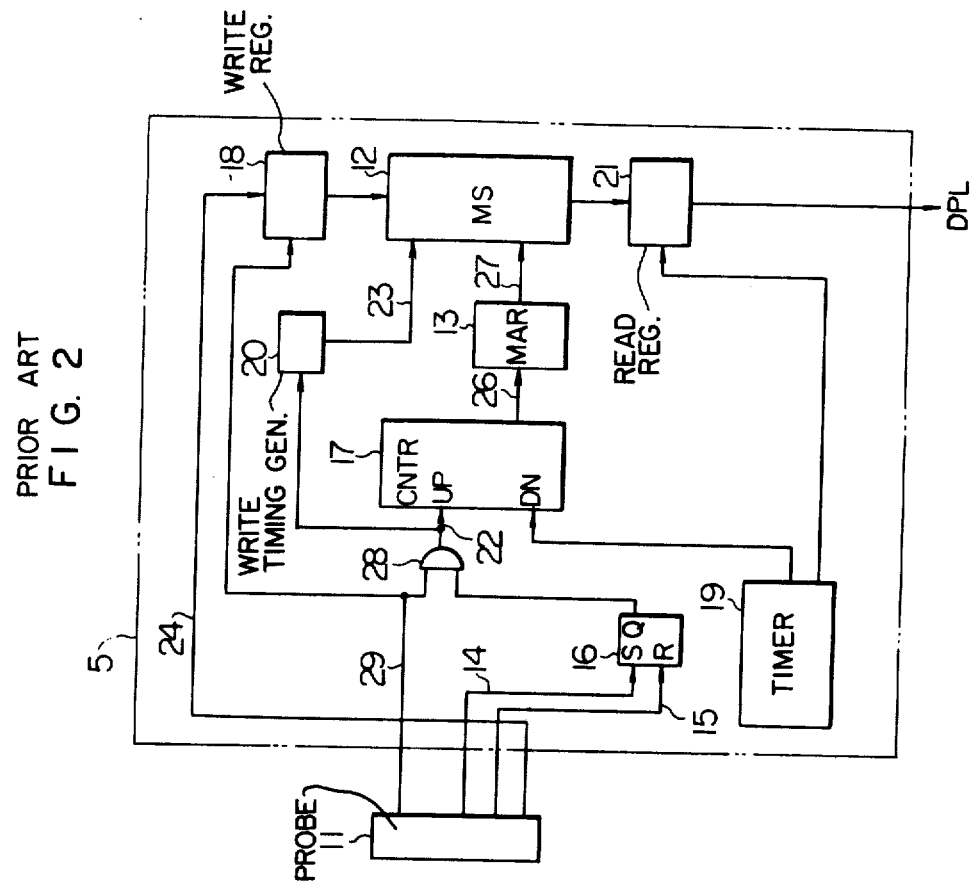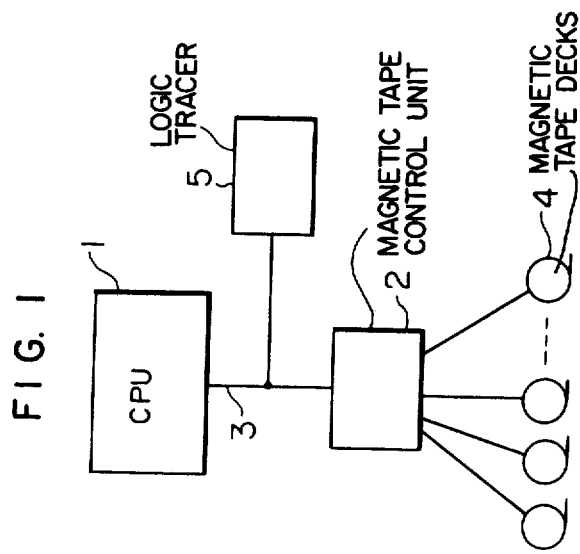

FIG. 3.
(PRIOR ART)

| 1 | A1 | B1 | C1 |
|---|----|----|----|
| 2 | A1 | B2 | C2 |
| 3 | A1 | B2 | C3 |
| 4 | A4 | B2 | C4 |
| 5 | A5 | B2 | C4 |
| 6 | A6 | B2 | C4 |
| 7 | A6 | B7 | C4 |
| 8 | A8 | B8 | C8 |
| ⋮ | ⋮  | ⋮  | ⋮  |
| 57 | A8 | B8 | C8 |
| 58 | A9 | B9 | C9 |

FIG. 4a.
(PRIOR ART)

| 0 | A1 | (1) |
| 1 | B1 | |
| 2 | C1 | |
| 3 | A1 | (2) |
| 4 | B2 | |
| 5 | C2 | |
| 6 | A1 | (3) |
| 7 | B2 | |
| 8 | C3 | |
| 9 | A4 | (4) |
| 10 | B2 | |
| 11 | C4 | |
| 12 | A5 | (5) |
| 13 | B2 | |
| 14 | C4 | |
| 15 | A6 | (6) |
| 16 | B2 | |
| 17 | C4 | |
| 18 | A6 | (7) |
| 19 | B7 | |
| 20 | C4 | |
| 21 | A8 | (8) |
| 22 | B8 | |
| 23 | C8 | |
| 24 | A9 | (9) |
| 25 | B9 | |
| 26 | C9 | |

FIG. 4b.
(PRIOR ART)

| 0 | 3 | A1 |
| 1 | 0 | A2 |
| 2 | 0 | A3 |
| 3 | 1 | A4 |
| 4 | 1 | A5 |
| 5 | 2 | A6 |
| 6 | 0 | A7 |
| 7 | 50 | A8 |
| 8 | 1 | A9 |
| 9 | 1 | B1 |
| 10 | 5 | B2 |
| 11 | 0 | B3 |
| 12 | 0 | B4 |
| 13 | 0 | B5 |
| 14 | 0 | B6 |
| 15 | 1 | B7 |
| 16 | 50 | B8 |
| 17 | 1 | B9 |
| 18 | 1 | C1 |
| 19 | 1 | C2 |
| 20 | 1 | C3 |
| 21 | 4 | C4 |
| 22 | 0 | C5 |
| 23 | 0 | C6 |
| 24 | 0 | C7 |
| 25 | 50 | C8 |
| 26 | 1 | C9 |

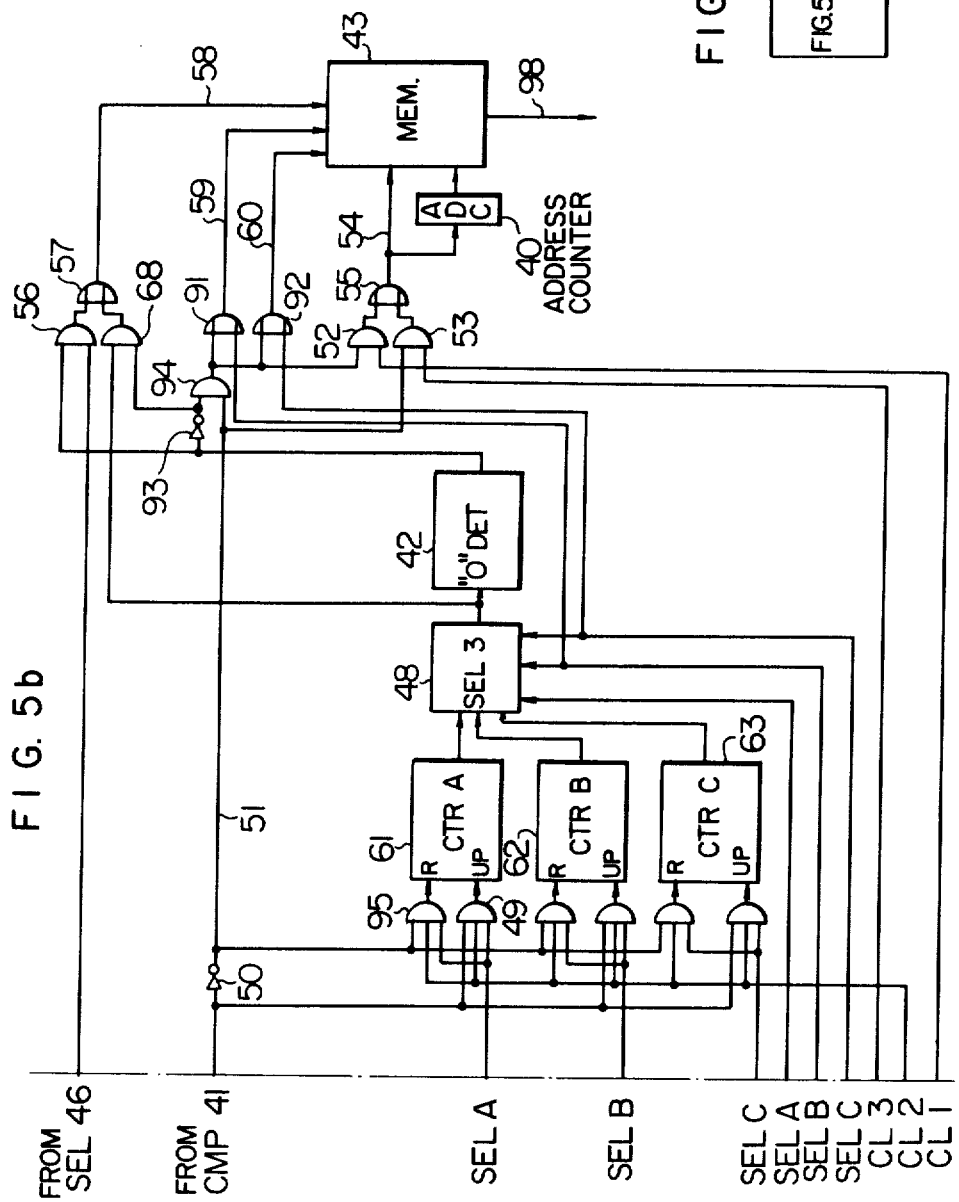

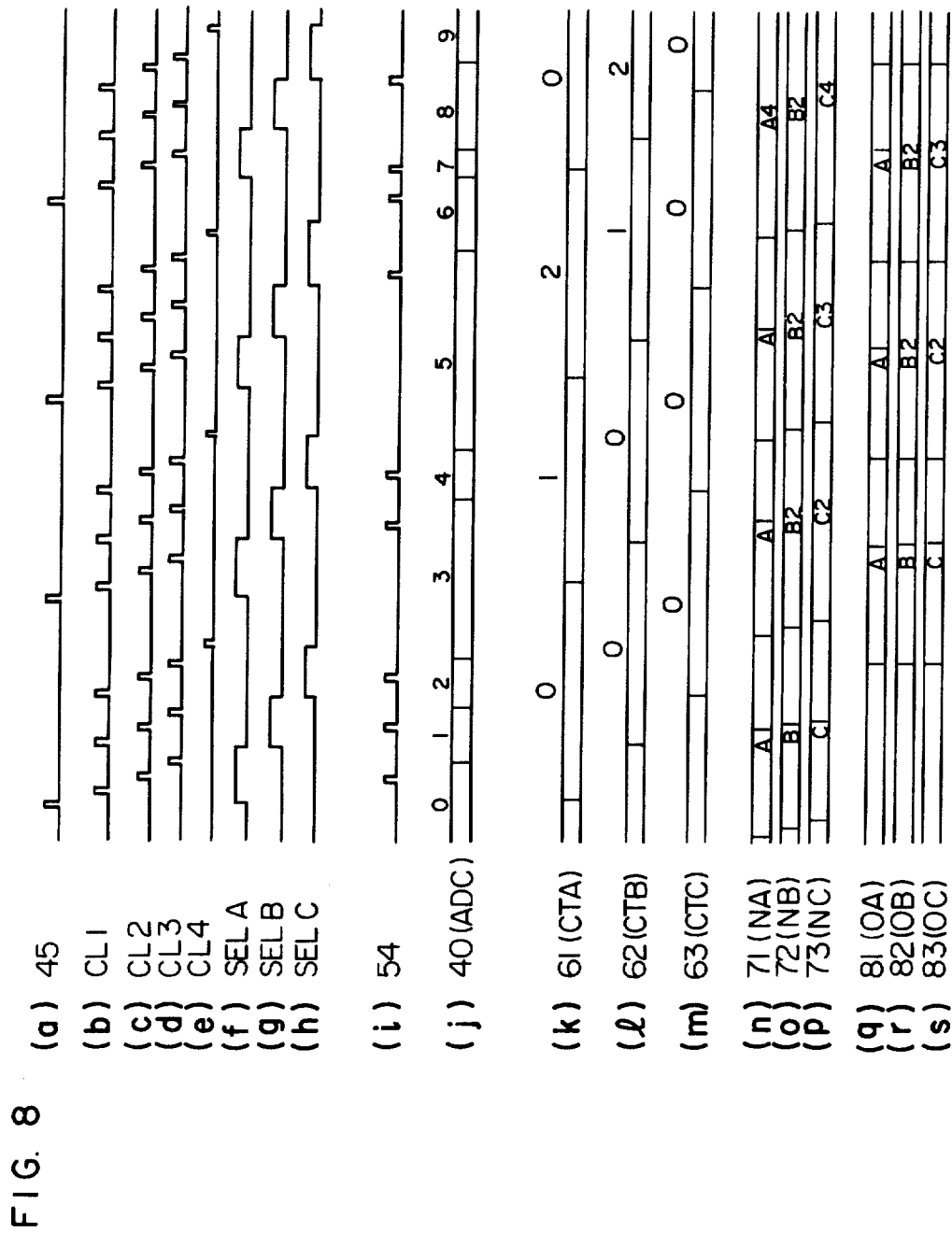

DATA COMPACTION SYSTEM WITH CONTIGUOUS STORAGE OF NON-REDUNDANT INFORMATION AND RUN LENGTH COUNTS

BACKGROUND OF THE INVENTION

There is generally known a device called a logic tracer which is constructed to store the past record of information generated in a time sequence from an electronic apparatus, such as an information processing system or the like. This invention relates to the improvement of the past record storing method in which such a logic tracer is employed.

When an erroneous operation is detected in the information processing system, the same operation is again repeated. If the repeated operation is not successful, the apparatus is considered to be defective and its operation is stopped, or the defective part is checked while the apparatus is being operated. Even if no defective part is detected, it is also necessary to test the operation of each part for proper maintenance and adjustment.

Upon examination of any trouble, using a maintenance operation or logic operation, holding the results of the logical processing and storing the past record of different kinds of information are effective to confirm normal operation, as well as to search for the cause of a defective operation or find the location of a defect in the system.

To this end, in the information processing system as, for example, shown in FIG. 1, a logic tracer 5 is connected to the IO interface line 3 between the central processing unit (CPU) 1 and the magnetic tape control unit 2 for controlling a plurality of magnetic tape decks 4, so as to store different kinds of instructions and the past record of various information signals sent from the magnetic tape control unit 2 to the CPU 1.

FIG. 2 is a block diagram of the logic tracer 5. This logic tracer 5 has a probe 11 for coupling the tracer 5 to the IO interface line 3, a memory 12 for storing the trace information, a memory address register 13 for holding the write address or read address for trace information, a write allowance latch 16 set by a start signal 14, and reset by a stop signal 15, a counter 17, a write register 18 for holding a sampled input data, read timing generator 19 for generating the read timing signal for the memory 12, a write timing generator 20 for generating the write timing signal to the memory 12, and a read register 21 for holding the read data.

Until the start signal is changed to the on-state, the allowance latch 16 is reset so that a reset signal 22 is not applied to the counter 17 and a write signal 23 is not applied to the memory 12. When the start signal 14 is changed to the on-state, the allowance latch 16 is set to open an AND gate 28 in synchronism with a sampling signal 29, allowing the counter 17 to be incremented and the memory 12 to write. In this case, input data 24 is stored in the write register 18 in synchronism with the sampling signal 29, and an address signal 27 on an output 26 of the counter 17 is applied to the memory 12 so that the memory 12 stores the contents of the input data 24.

In FIG. 2, the memory 12 may be a special memory for the external or a memory region for exclusive use of maintenance which is incorporated in an external unit (for example, magnetic disk control unit).

Moreover, in FIG. 2, the data read from the memory 12 is applied to an external visible display DPL, and the visible output thereof is watched by a maintenance or adjustment operator.

The conventional information recording methods using the logic tracer 5 will now be explained.

Let us assume that information to be stored in the memory 12 includes IO addresses and commands supplied from the CPU 1 to the magnetic tape control unit 2 and IO status supplied from the magnetic tape control unit 2 to the CPU 1, and that the different IO addresses are nine in number A1 to A9, the different commands are nine in number B1 to B9 and the different IO status information is nine in number C1 to C9.

An example shown in FIG. 3 corresponds to the case where there are a set of three information items including the IO address and command supplied from the CPU and the IO status corresponding thereto and these are successively stored in the memory for each IO control operation of the CPU. In FIG. 3, the numerals 1 to 58 shown in the left column represent the number of the control operations by the CPU and the right column represents a set of information items stored in the memory. According to the method of FIG. 3 of storing all the information, however, if the same control operation is repeatedly performed as in, for example, a continuous reading operation in a magnetic tape, the information of quite identical contents must be repeatedly stored in the memory, as shown in FIG. 3 as the eighth to fifty-seventh storing operations, thereby resulting in wasteful use of the memory area.

FIG. 4a shows a method for increasing the use efficiency of the memory, in which the recording in a memory is made only when the information combination in a set of newly-generated information items is different from that in a set of information items previously stored in the memory. According to the method shown in FIG. 4a, it is not necessary to store redundant information in FIG. 3 generated repeatedly in the ninth to fifty-seventh control operations which involve the same information combination as the information (A8, B8, C8) to be stored in the eighth control operation. However, which control operation has been repeated, cannot be determined from the contents stored in the memory. Therefore, the correct search of the system operation upon the occurrence of an erroneous or defective operation is impossible. Further, the method shown in FIG. 4a cannot provide a complete elimination of the recording of redundant information since even when only one of the information items in a given set changes, all the information in that set is stored in a three-byte area of the memory.

FIG. 4b shows another method for increasing the use efficiency of the memory, in which a memory is provided with storage regions associated with respective information items of the same kind, and the number of times each information item is generated is stored in the associated storage region. According to this method, trace information can be stored in a limited memory area irrespective of the number of times of occurrence of the control operations. But, a sequential change of control operations cannot be examined, as is apparent from FIG. 4b.

SUMMARY OF THE INVENTION

It is an object of the invention to provide an information storing method which provides for storing a past record, with the above-mentioned problems obviated, and which is capable of increasing the storing efficiency of the memory.

The invention is characterized in that the number of times the same information occurs is counted, and when information is changed, the current count and tye newly occuring information are stored in a memory.

BRIEF DESCRIPTION OF THE DRAWINGS

This invention will be now described in conjunction which the accompanying drawings, in which:

FIG. 1 is an explanatory diagram useful for explaining an application of a logic tracer;

FIG. 2 is a block diagram of the conventional logic tracer;

FIG. 3 is a table showing the writing state of a memory of the logic tracer of FIG. 2;

FIGS. 4a and 4b are tables showing the writing state of a memory of the conventional logic tracer;

FIGS. 5a and 5b are block diagrams of the logic tracer as one embodiment of the invention;

FIG. 6 shows the relation between FIGS. 5a and 5b;

FIG. 8 is a timing chart of FIGS. 5a and 5b; and

FIGS. 9a and 9b are tables showing the writing state of a memory of the conventional logic tracer, and that of the logic tracer of FIG. 5a and 5b.

DETAILED DESCRIPTION OF A PREFERRED EMBODIMENT

An embodiment of this invention will hereinafter be described with reference to the accompanying drawings.

Figure 5A:
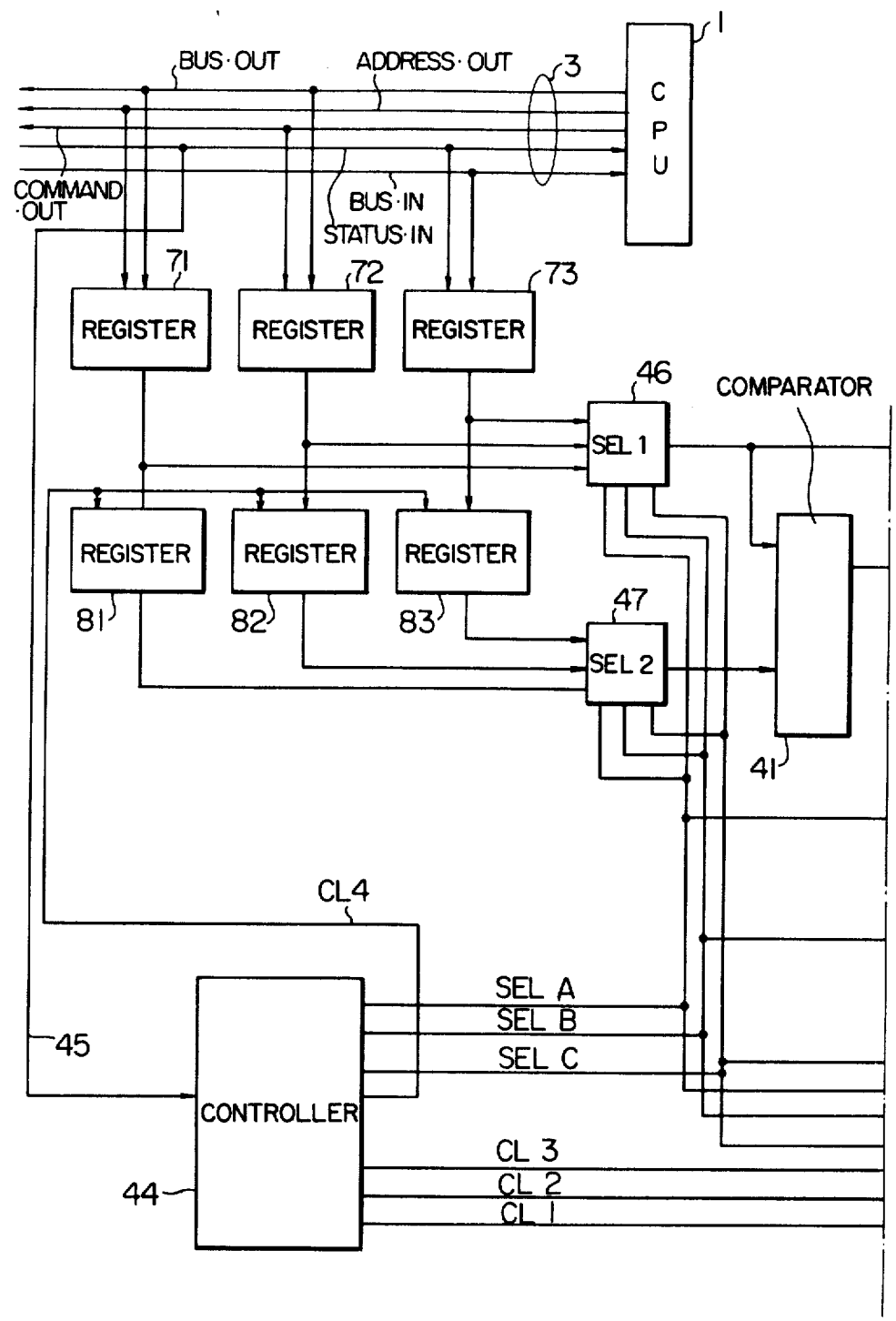

FIG. 5a and 5b are block diagrams of a logic tracer as one embodiment of the invention. The logic tracer, as shown in FIG. 6 is the combination of the arrangements of FIGS. 5a and 5b.

The logic tracer 5 is connected to the IO interface line 3 for coupling the CPU 1 and an input/output control unit IOC such as the magnetic tape control unit 2 as shown in FIG. 1. This connecting portion may be the probe 11 in FIG. 2. Although the IO interface line 3 may be of any type, it includes, in this embodiment, a BUS-OUT line for transferring data, a command, and an IO address to the IOC, a BUS-IN line for transferring data and an IO address to the CPU, an ADDRESS-OUT line for transferring an ADDRESS-OUT signal which indicates that an IO address is supplied to the BUS-OUT line, a COMMAND-OUT line for transferring a COMMAND-OUT signal which indicates that a command is supplied to the BUS-OUT line, and a STATUS-IN line for transferring a STATUS-IN signal which shows that IO status is supplied to the BUS-IN line. This IO interface line is of the well known type.

Figure 7:
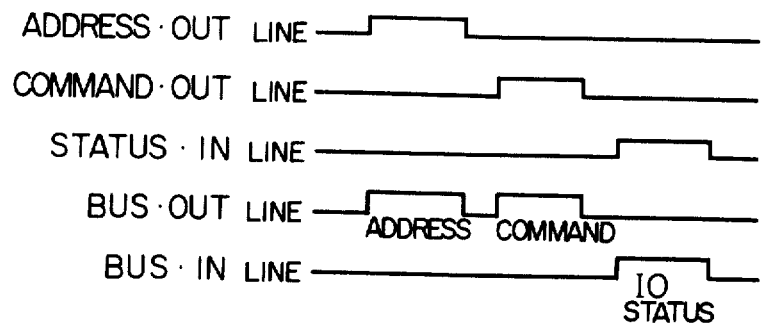
FIG. 7 is a timing chart of the CPU start sequence on the IO interface line.

There is a sequence through which the IOC is started by the CPU 1. Upon initiation of this start sequence IO address, command and IO status appear on the IO interface line 3 as shown in FIG. 7. The logic tracer of FIGS. 5a and 5b stores these information signals each time the sequence occurs. FIG. 7 shows only the signals necessary for explaining the sequence.

The logic tracer has three registers 71 to 73, called first registers, connected to the IO interface line 3. The first register 71 stores the contents of the BUS-OUT line representing the IO address in response to the leading edge of the ADDRESS-OUT signal. The first register 72 stores the contents of the BUS-OUT line representing a command in response to the leading edge of the COMMAND-OUT signal. The first register 73 stores the contents of the BUS-IN representing the IO status in response to the leading edge of the STATUS-IN signal.

When the first registers 71 to 73 are set to store the IO address, command and IO status (hereinafter, represented by A, B and C), respectively, the information signals which have been stored therein, are transferred to second registers 81 to 83, respectively just before the signals A, B and C are stored in the first registers 71 to 73.

The logic tracer also includes a comparator 41 for comparing the contents of the first registers 71 to 73 with those of the second registers 81 to 83, counters 61 to 63 for counting the number of times of occurrence of the information signals A, B and C, a zero detector 42 for detecting that the contents of the counters 61 to 63 are zero, a memory 43 in which the information signals A, B and C are to be stored, an address counter 40 for indicating the write address to the memory 43, and a controller 44 for supplying selection signals and clock or timing signals to be described later.

The address counter 40 is initially set to zero. After the memory 43 is once written in, the content of the address counter 40 is incremented, to always indicate the address in which the next information is to be stored. The address counter 40 may be of the type in which the contents are returned to zero when its maximum count has been exceeded. Also, the memory 43 is allowed to write plural times at the same address. This is because the information desired to be stored in the memory 43 is only the newest one.

The controller 44 is connected through a signal line 45 to the STATUS-IN line of the IO interface line 3, and starts processing from the time at which the STATUS-IN signal falls off. The controller 44 sequentially supplies selection signals SELA, SELB, and SELC to three selectors 46 to 48 to control the operation thereof. Meanwhile, clock signals CL1, CL2 and CL3 are sequentially supplied to control the operation of the counters 61 to 63 and a logic gate group. Finally, a clock signal CL4 is supplied to permit the contents of the first registers 71 to 73 to be transferred to the second registers 81 to 83, thus completing one-cycle of processing.

In this way, the logic tracer processes information signals A, B and C in a time-sharing manner. Now, let us describe the operation for processing the information signal A.

First, let it be assumed that the content of the first register 71 coincides with that of the second register 81 (the first case). In this case, the clock signal CL2 from the controller 44, the coincidence output from the comparator 41 and the selection signal SELA are applied to an AND gate 49 to produce an output therefrom by which the counter 61 is incremented. At this time, since an inverter 50 turns an output line 51 off, AND gates 52 and 53 are closed. Consequently a write command line 54 has no signal and the memory 43 is prevented from writing.

When the contents of the first register 71 do not coincide with those of the second register 81 and the contents of the counter 61 are zero (the second case), the inverter 50 turns the output line 51 on to cause the AND gate 53 to produce an output, together with the clock signal CL3. Thus, the OR gate 55 produces an output signal on a write command line 54 to instruct the memory 43 to write, and the address counter 40 to increment its contents after the writing operation.

On the other hand, the contents of the counter 61 are transferred via the selection circuit 48 to the zero detector 42 by the application of the selection signal SELA. When the zero detector 42 detects zero, the AND gate 56 opens its gate, permitting the output of the selection circuit 46 representing the contents of the first register 71 to be sent via an OR gate 57 and a write data line 58 to the memory 43. At the same time, two bits of "0" and "0" indicating that the contents of the first register 71 is information A, are sent via signal lines 59 and 60 to the memory 43 where they are stored at the same address. The indexes "0", "0" in this case is applied by the selection signals SELB and SELC which are absent when the selection signal SELA is present.

When the contents of the first register 71 do not coincide with those of the second register 81 and the contents of the counter 61 are not zero (the third case), the inverter 50 turns the output line 51 on, and the contents of the counter 61 are transferred via the selection circuit 48 to the zero detector 42 by the application of the selection signal SELA. When the zero detector 42 does not detect zero, an inverter 93 turns its output on to open an AND gate 94. Consequently, the output of the AND gate 94 and the clock signal CL1 are applied to the AND gate 52, which then supplies an output signal via an OR gate 55 to a write command line 54. Thus, the memory 43 and the address counter 40 are instructed to write and increment its contents, respectively.

On the other hand, since the output of the inverter 93 is in the ON-state, and AND gate 68 is open, and thus the output of the selection circuit 48 is applied to the memory 43 via an OR gate 57 and a write data line 58. At the same time, two bits of indexes "1" and "1" indicating that the stored data is the count, are written in the memory 43 at the same address via the signal lines 59 and 60. In this case the indexes "1", "1" are supplied from the AND gate 94 through the OR gates 91 and 92 and the signal lines 59 and 60, respectively.

The above count is written in synchronism with the clock signal CL1, and then when the clock signal CL2 is generated, the AND gate 95 is supplied with the clock signal CL2, the output 51 from the inverter 50 and the selection signal SELA, thereby to produce an output so as to reset the counter 61. When the counter 61 is reset, the contents become zero, and therefore the same operation as that of the second case is performed, with the result that the contents of the first register 71 and the indexes "0", "0" are stored in the memory 43.

Although the information signals B and C are successively processed in the same manner as the information A, by the logic tracer, the indexes for information signals B and C are "0", "1" and "1", "0" respectively. In this case, the indexes for information B, C are the selection signal SELB, SELC which are supplied via OR gate 91, 92 to signal line 59, 60, respectively.

Finally, when a clock signal CL4 is supplied from the controller 44 to the second registers 81 to 83, the contents of the first registers 71 to 73 are transferred to the second registers 81 to 83, thus one-cycle of processing is finished.

FIG. 8 is a timing chart for the arrangements of FIGS. 5a and 5b, showing the states of signals, signal lines, and registers. In FIG. 8, the period of the STATUS-IN signal appearing on the line 45 is the one-cycle processing period for the respective information signals A, B and C. In addition, since the information signals A, B and C are set in the first registers 71 to 73 between the clock signal CL4 and the next STATUS-IN signal, the time interval between both signals in effect, is long enough, but for convenience the time interval is compressed in the illustration.

FIGS. 9a and 9b show the comparison of the memory contents obtained by use of the conventional apparatus with those by use of the apparatus according to the invention. FIG. 9a shows the information in the memory of the conventional apparatus. In the addresses 0 to 173 are stored 58 sets of information signals A, B and C in turn, one set thereof being stored at each processing cycle. FIG. 9b shows the information in the memory 43 according to this invention. In the addresses 0 to 23 are stored changed information and the number of times the same information is repeatedly generated for each of 58 processing cycles. FIGS. 9a and 9b show the case where identical item of information are generated, and thus it will be seen that the memory capacity of FIG. 9b is about 1/7 to $\frac{1}{8}$ of that of FIG. 9a.

Referring to FIG. 9b, the first cycle processing treats three different values so that A1, B1 and C1 are stored in the addresses 0 to 2, and the second cycle processing treats two different values for only B and C so that B2 and C2 are stored in the addresses 3 and 4, respectively. Then, the third cycle processing treats one different value for only C so that C3 is stored in the address 5 and the fourth cycle processing treats two different values for only A and C so that A4 and C4 are stored in the addresses 7 and 8. In the fourth cycle, to record the number of times the same value is processed, detection is made of three times the A1 is transmitted until A4 (the contents of the counter 61) and as a result "3" is stored in the address 6. Similarly, when the fifty-eighth cycle processing comes, the number of times, "50" the same value is processed and the changed values of A, B and C are stored in the addresses 18 to 23.

The information signals written in the memory 43, when, for example, a trouble occurs, are read via a signal line 98 in sequence, and supplied to a visible information output unit such as a display or a printer. Operators for maintenance or adjustment analyze the visible information on the output unit to search the location of the trouble.

The STATUS-IN signal is produced not only in the CPU start sequence as shown in FIG. 7, but also in other sequences. Thus, at that time the writing operation is naturally effected in the memory 43 similar to the previous description. In this case, however, IO address and command are not necessarily included.

Although one embodiment of the invention has been described, other various modifications are possible.

The information to be stored in the memory is not limited to only the signal appearing on the IO interface line of the information processing system, but may be the information in different electronic apparatus.

Moreover, while when a new information and previous information are not coincident with each other, the count and then the new information are stored in the memory, as described above, but the order of writing may be reversed.

Furthermore, while the count and the new information are written in adjacent addresses of the memory with the distance between both addresses being 1, this address distance may be much greater.

In short, it is necessary only to store the count and the newly generated information in the addresses of the memory between which a predetermined distance is kept. Therefore, the operators for maintenance or adjustment can read the count and the newly generated information by considering the address distance when checking the contents of the memory.

If the count and the newly generated information are written in adjacent addresses, the address control of the memory becomes simple as naturally expected.

Moreover, while three different information signals are stored in the memory as described above, four or more different information signals may be stored, or only one information signal may be stored therein. The former case requires an increase of the bit number of the index and the latter case needs a bit number only capable of discriminating between information and the number of times, or 1 bit of index.

While three different information signals are stored in the same memory as described previously, separate memories may be provided for storing each bit of index.

Moreover, while the logic tracer has various kinds of registers, counters, comparators and the like, a general-type computer or microcomputer may be used which includes registers, and operational circuits. In this case, however, the flow of information in a microcomputer used is naturally controlled by the program.

According to the invention, when sequential information is stored in a memory, the capacity of memory may be small, which leads to the improvement of storing efficiency of the memory. The method of the invention is very effective particularly for the case where the same information occurs repeatedly many times.

What is claimed is:

1. An information storing method for storing in a memory the past record of a plurality of information signals generated in time sequence, said method comprising the steps of:
    generating a plurality of information signals in time sequence;
    comparing a newly-generated information signal and the previously-generated information signal as each information signal is generated;
    incrementing a count when coincidence is obtained at said comparing step;
    writing each newly-generated information signal at a storage location in said memory next to the storage location of the previously-generated information signal when coincidence is not obtained at said comparing step at a time when said count is zero;
    writing the value of said count at a storage location in said memory next to the storage location of said previously-generated information signal when coincidence is not obtained at said comparing step at a time when said count is not zero and then writing said newly-generated information signal at a storage location in said memory next to the storage location where the value of said count is stored; and
    clearing said count to zero when the value of the count has been stored in said memory.

2. An information storing method according to claim 1, wherein said plurality of information signals are grouped into a plurality of kinds, and for each kind of information said comparing step, said counting step and said clearing step are sequentially performed in a time sharing manner.

3. An information storing method according to claim 1 or 2, wherein in said writing step, each of the count and the information is written at a storage location in said memory together with a code added thereto for discriminating the content to be stored.

4. A system for storing in time sequence the past record of control information signals which are communicated between a central processing unit and an IO control unit connected to each other through an information bus, comprising:
    memory means for storing the past record of said information signals;
    first buffer memory means connected to said information bus for storing a plurality of kinds of information signals to be stored in said memory means;
    second buffer memory means connected to said first buffer memory means for storing the information signals previously stored in said first buffer memory means each time new information is stored in said first buffer memory means;
    comparing means connected to said first and second buffer memory means for comparing the new and previous information signals of the same kind successively supplied from said first and second buffer memory means;
    counter means connected to said comparing means for incrementing a count corresponding to the kind of information when said comparing means detects coincidence between the two information signals supplied thereto from said first and second buffer memory means;
    discriminating means for discriminating whether or not the count of said counter means corresponding to the kind of information signal compared by said comparing means is zero; and
    access means responsive to said discriminating means for selecting the contents to be stored in said memory means when said comparing means detects anti-coincidence between the two information signals supplied thereto, said access means including means for causing the new information signal from said first buffer memory means to be stored in said memory means when said discriminating means detects the count of zero, while causing the count and then the new information signal from said first buffer memory means to be stored in adjacent storage locations in said memory means when said discriminating means detects a count other than zero.

5. A system according to claim 4, wherein said first buffer memory means stores address information and command information sent on said information bus to said IO control unit by said central processing unit, and status information which is supplied on said information bus to said central processing unit by said IO control unit.

* * * * *